United States Patent [19]
Somei

[11] Patent Number: 5,649,311
[45] Date of Patent: Jul. 15, 1997

[54] SWITCHING CIRCUIT FOR A SATELLITE BROADCASTING CONVERTER CAPABLE OF ASSURING A HIGH SENSITIVITY

[75] Inventor: Junichi Somei, Nara, Japan

[73] Assignee: Sharp Kabushiki Kaisha, Osaka, Japan

[21] Appl. No.: 464,560

[22] Filed: Jun. 5, 1995

[30] Foreign Application Priority Data

Apr. 25, 1995 [JP] Japan ................. 7-099285

[51] Int. Cl.$^6$ ................. H04B 1/18; H04B 3/44
[52] U.S. Cl. ................. 455/188.1; 455/3.2; 455/131
[58] Field of Search .............. 455/3.2, 3.3, 4.2, 455/180.1, 188.1, 188.2, 190.1, 289, 293, 6.1, 6.2, 131; 327/18, 19, 20, 21, 77

[56] References Cited

U.S. PATENT DOCUMENTS

| | | | |
|---|---|---|---|
| 4,509,198 | 4/1985 | Nagatomi | 455/131 |
| 4,538,175 | 8/1985 | Balbes et al. | 455/12.1 |
| 4,554,552 | 11/1985 | Alford et al. | |
| 4,592,093 | 5/1986 | Ouchi et al. | 455/187 |
| 5,206,954 | 4/1993 | Inoue et al. | 455/6.2 |
| 5,263,182 | 11/1993 | Park | 455/188.1 |

FOREIGN PATENT DOCUMENTS

| | | |
|---|---|---|
| 0314930 | 5/1989 | European Pat. Off. . |
| 0361672 | 8/1989 | European Pat. Off. . |
| 2350514 | 4/1975 | Germany . |
| 3808280 | 9/1989 | Germany . |
| 4025241 | 2/1992 | Germany . |
| 4132287 | 4/1992 | Germany . |
| 486027 | 3/1992 | Japan . |
| 2251146 | 6/1992 | United Kingdom . |

*Primary Examiner*—Edward F. Urban

[57] ABSTRACT

There is provided a switching circuit of a BS converter capable of assuring a high sensitivity. A BS tuner superimposes a band switching pulse signal on a power voltage when selecting a high band, and supplies the resulting signal to a BS converter. The BS converter amplifies a pulse signal selected by a filter circuit of a switching circuit by ten times in a differential amplifier, rectifies the resulting signal in a rectifying circuit, and compares the resulting signal with a reference voltage in a comparator circuit, thereby detecting the presence or absence of the band switching pulse signal. When the band switching pulse signal is detected, a high-band local oscillator is turned on by a drive circuit. When the signal is not detected, a low-band local oscillator is turned on. Thus, by amplifying by about ten times the band switching pulse signal having a voltage of about 0.6 V, a reception frequency band is switchedly selected with high accuracy.

19 Claims, 4 Drawing Sheets

SWITCHING CIRCUIT FOR A SATELLITE BROADCASTING CONVERTER CAPABLE OF ASSURING A HIGH SENSITIVITY

BACKGROUND OF THE INVENTION

1. Field of the Invention

The present invention relates to a switching circuit of a BS (Broadcast of Satellite) converter for selecting between reception signal bands of satellite broadcast.

2. Description of the Prior Art

According to digitization of a BS system and the corresponding increase in number of channels, there has been an attempt at widening each reception frequency band. For instance, in a reception frequency band of 10.7 GHz to 12.75 GHz, the frequency band is generally divided into a frequency band of 10.7 GHz to 11.7 GHz and a frequency band of 11.7 GHz to 12.75 GHz. Consequently, in order to receive both the frequency bands, there are necessitated two independent sets of an antenna and a BS converter.

In recent years, in order to receive both the frequency bands by means of one antenna and one BS converter, there has been desired a system capable of receiving both the frequency bands by means of one BS converter by changing an oscillation frequency of a local oscillator provided in a BS converter based on an external pulse signal superimposed on a power voltage.

As a pulse signal processing circuit, a digital-to-analog converter circuit such as a peak detection circuit and a pulse-to-voltage converter circuit (pulse rate meter) are known.

FIG. 4 is a circuit diagram of the pulse rate meter. The pulse rate meter is a circuit for obtaining an output signal proportional to a pulse rate (representing an amount of pulses included in a second) of an input signal.

In the circuit shown in FIG. 4, when a pulse having a peak value Vs is incorporated into the input signal, an electric charge $Q$ ($=Vs \cdot Cp$) flows into a capacitor Cf having a capacitance Cf through a pump circuit composed of diodes D1 and D2, and there can be obtained an output signal of a staircase having a good linearity wherein a peak value of one step corresponds to Vo ($=(Cp/Cf) \cdot Vs$). In the above place, in order to reduce a swing range of a meter M, the Cf/Cp value is greatly increased and the Rf value also is increased.

However, when the above-mentioned pulse rate meter is used as a pulse processing circuit for a switching circuit of a BS converter, there are problems as follows.

That is, in the pulse rate meter, an analog output corresponding to a pulse level, pulse width or the like can be obtained. However, a required circuit characteristic of a pulse processing circuit for a switching circuit of a BS converter as described above is to decide only whether a pulse is present or absent. Therefore, a complicated circuit as shown in FIG. 4 is not necessitated.

Furthermore, the pulse voltage to be superimposed on the power voltage is a very small voltage of 0.6 V±0.2 V, and since a very great Cf/Cp rate is set in a pulse rate meter as shown in FIG. 4, a significantly degraded sensitivity results when the pulse peak value Vs of the input signal is too small. Therefore, in a pulse rate meter as shown in FIG. 4, it is very difficult to make the BS converter perform a switching operation.

SUMMARY OF THE INVENTION

An object of the present invention is therefore to provide a switching circuit of a BS converter capable of assuring a high sensitivity with a simple circuit construction.

In order to achieve the aforementioned object, there is provided a switching circuit of a BS (Broadcasting of Satellite) converter for switching over between a plurality of local oscillators which have different oscillation frequencies and which are provided in the BS converter according to a pulse signal transmitted from a BS tuner, the pulse signal being formed by superimposing a band switching pulse signal on a power voltage, or formed by only the power voltage, including: a filter circuit which takes in the pulse signal from the BS tuner, extracts only a frequency component of the band switching pulse signal and outputs an extracted pulse signal; an amplifier circuit which amplifies the extracted pulse signal from the filter circuit and outputs an amplified pulse signal; a rectifying circuit which rectifies the amplified pulse signal from the amplifier circuit; a comparator circuit which compares a DC (Direct current) voltage obtained from the rectifying circuit with a reference voltage and outputs a signal representing whether or not the band switching pulse signal is superimposed on the power voltage; and a drive circuit which drives a local oscillator having an oscillation frequency corresponding to a result of the comparison process among the local oscillators upon receiving a signal from the comparator circuit.

In the above-mentioned construction, the pulse signal is inputted from the BS tuner in order to decide a reception frequency band. Then, only the frequency component of the band switching pulse signal is extracted from the pulse signal by the filter circuit. Then the resulting signal is amplified in the amplifier circuit, and rectified by the rectifying circuit. A DC voltage obtained from the rectifying circuit is further compared with the reference voltage in the comparator circuit, and a signal representing whether or not the band switching pulse signal is superimposed on the power voltage is outputted. The drive circuit drives a local oscillator having an oscillation frequency corresponding to a result of the comparison process upon receiving the signal from the comparator circuit.

Thus the local oscillator of the reception frequency band designated by the BS tuner is driven.

In a preferred embodiment, the rectifying circuit is formed of diodes.

In the above-mentioned embodiment, only the frequency component of the band switching pulse signal is extracted by the filter circuit. When the amplified pulse signal amplified in the amplifier circuit is inputted to the rectifying circuit, the amplified pulse signal is rectified by the diodes, and then inputted to the comparator circuit.

In a further preferred embodiment, the filter circuit is a low-pass filter.

In the above-mentioned embodiment, when the pulse signal is inputted from the BS tuner, high-frequency noises are removed from the pulse signal by the low-pass filter constituting the filter circuit. Consequently, the high-frequency noises are removed from the pulse signal so as to extract only the frequency component of the band switching pulse signal, and the extracted pulse signal is transmitted to the amplifier circuit.

In a still further preferred embodiment, the filter circuit is a band-pass filter.

In the above-mentioned embodiment, when the pulse signal is inputted from the BS tuner, noises of frequency components except for the frequency component of the band switching pulse signal are removed by the band-pass filter constituting the filter circuit.

Thus, only the frequency component of the band switching pulse signal is extracted and transmitted to the amplifier circuit.

In a yet further preferred embodiment, the amplifier circuit includes an amplification factor adjuster for adjusting an amplification factor of the extracted pulse signal.

In the above-mentioned embodiment, the amplification factor of the amplifier circuit is adjusted by the amplification factor adjuster. According to the adjusted amplification factor, responsiveness in switching over between the local oscillators is set.

In another preferred embodiment, there is provided a reference voltage adjuster for adjusting the reference voltage.

In the above-mentioned embodiment, the reference voltage is adjusted by the reference voltage adjuster. According to the adjusted reference voltage, responsiveness in switching over between the local oscillators is set.

In yet another preferred embodiment, the rectifying circuit is provided with a filter.

In the above-mentioned embodiment, when the pulse signal which is the band switching pulse signal that is superimposed on the power voltage is rectified by the rectifying circuit, noises such as the frequency component of the band switching pulse signal are removed from the signal obtained through the rectifying process by the filter.

Thus the possible superimposition of noises on the drive signal from the drive circuit to the local oscillator can be prevented.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The present invention will be described in greater detail below based on an embodiment thereof with reference to the accompanying drawings.

Figure 1:
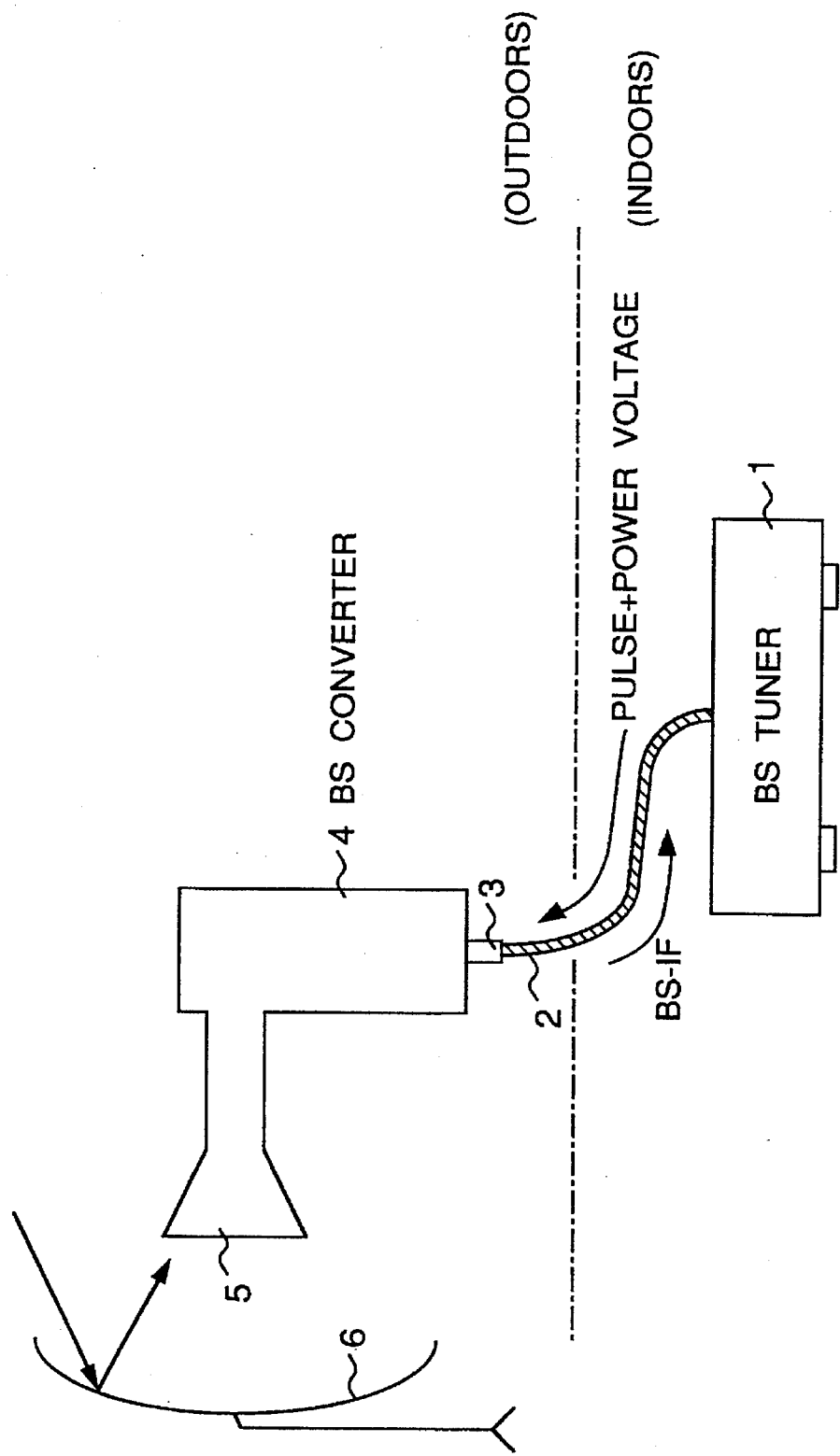
FIG. 1 is a schematic view of a satellite broadcast reception system provided with a switching circuit of an embodiment of a BS converter of the present invention.

FIG. 1 is a schematic view of a satellite broadcast reception system provided with a switching circuit of a BS converter according to an embodiment of the present invention.

A parabola antenna 6 and a BS converter 4 are installed outdoors, and a pulse signal formed by superimposing a band switching pulse on a power voltage is supplied from a BS tuner 1 to the BS converter 4 through a BS cable 2.

Meanwhile, a BS signal (a microwave signal in a 12-GHz band) from a satellite is reflected on the parabola antenna 6 and inputted to the BS converter 4 via a feed horn 5. Then, the BS signal is subjected to a frequency conversion process to be converted into an intermediate frequency of 1 GHz so that it can be transmitted via a generic coaxial cable, and the obtained signal having the intermediate frequency (referred to as a BS-IF signal hereinafter) is supplied to the BS tuner 1 installed indoors via an F-type connector 3.

The band switching pulse signal is superimposed on the power voltage and supplied (turned on) when a high band (11.7 GHz to 12.75 GHz) is selected by the BS tuner 1. When a low band (10.7 GHz to 11.7 GHz) is selected, the pulse signal is not supplied (turned off).

The band switching pulse signal generally has a very low frequency of 22±4 kHz, so that it exerts no influence on the frequencies of 950 MHz through 2150 MHz of the BS-IF signal.

Figure 2:
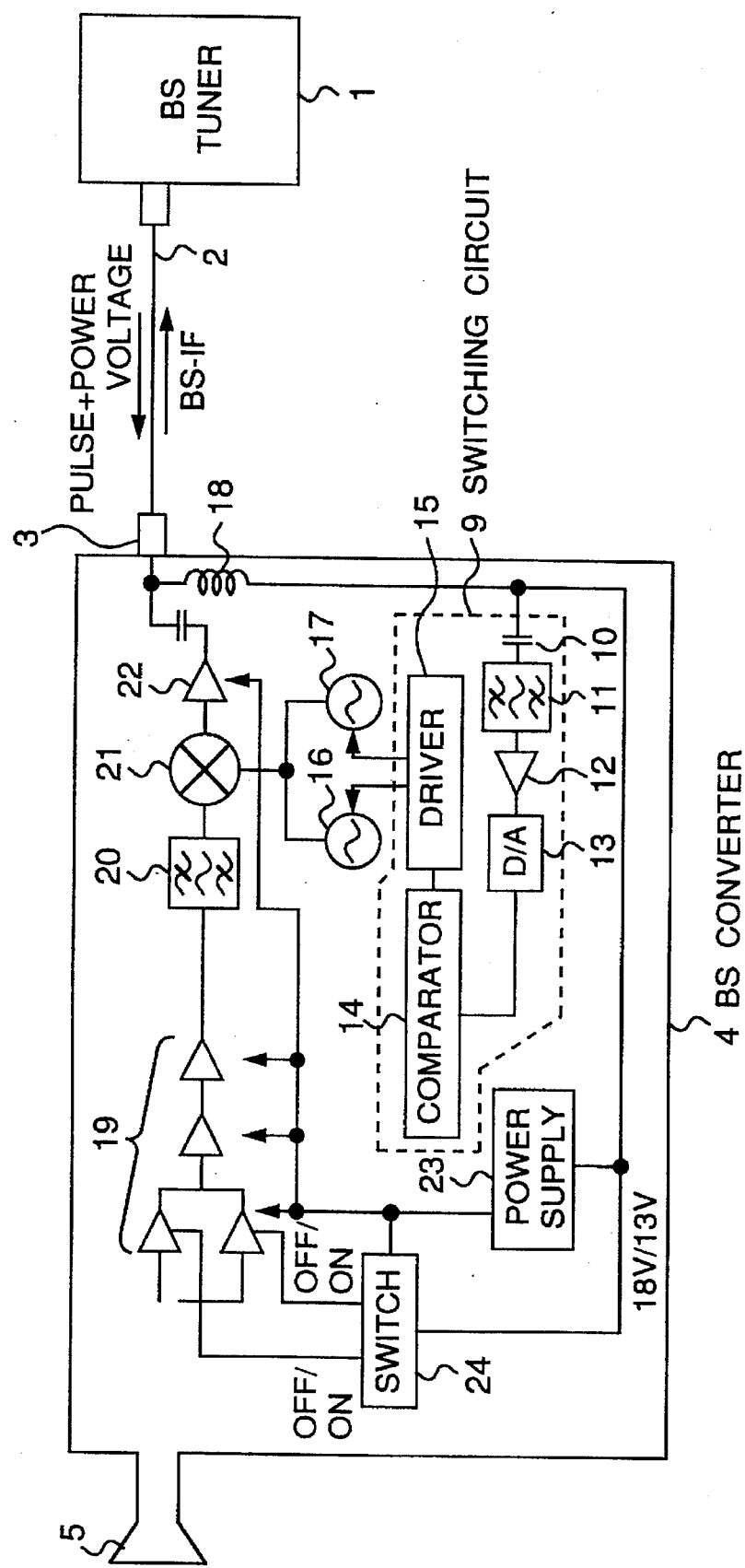
FIG. 2 is a diagram showing a circuit inside the BS converter shown in FIG. 1.

FIG. 2 is a diagram of a circuit inside the BS converter 4.

The above-mentioned pulse signal outputted from the BS tuner 1 is inputted to the BS converter 4 via the BS cable 2 and the F-type connector (BS converter output terminal) 3. Then, the BS-IF signal is cut off by an BS-IF signal cutoff inductor 18, so that only a pulse signal formed by superimposing the band switching pulse signal on the power voltage is supplied to a switching circuit 9.

The switching circuit 9 cuts off a DC component of the inputted pulse signal by means of a DC cutoff capacitor 10, cuts off frequency components except for a frequency component of 22 kHz±4 kHz (frequency of the band switching pulse signal) by means of a filter circuit 11, amplifies the resulting signal in a differential amplifier 12, converts the resulting signal into a DC voltage by means of a rectifying circuit (digital-to-analog converter circuit) 13, and detects the voltage of the band switching pulse signal by means of a comparator circuit 14 to control a drive circuit 15.

The drive circuit 15 turns on a high-band local oscillator 16 according to a detection signal from the comparator circuit 14 when the band switching pulse signal is superimposed (when the high band is selected), and turns off a low-band local oscillator 17. Conversely, when the band switching pulse signal is not superimposed (when the low band is selected), the drive circuit 15 turns off the high-band local oscillator 16 and turns on the low-band local oscillator 17.

Figure 3:
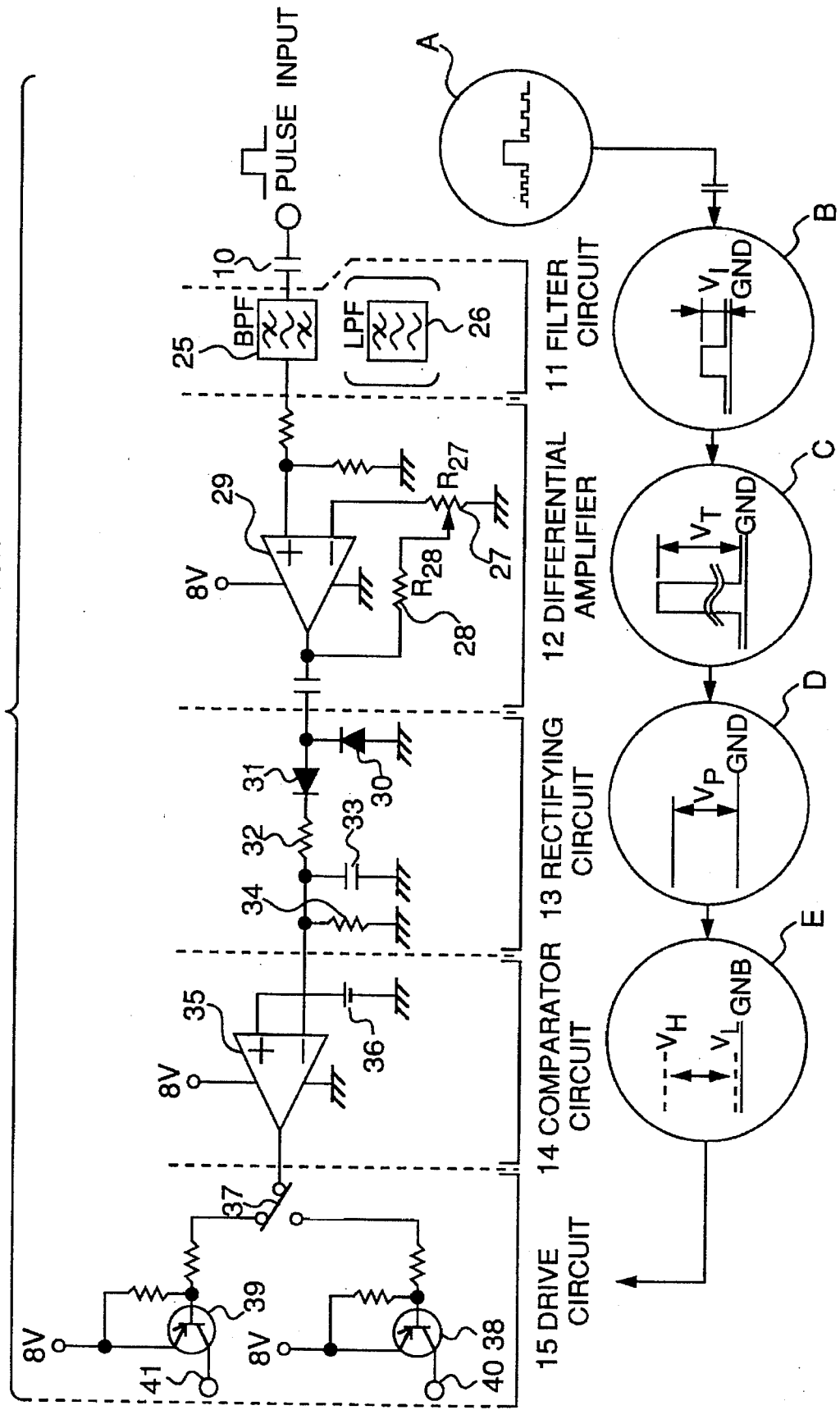
FIG. 3 is a practical circuit diagram of the switching circuit shown in FIG. 2.
Figure 4:
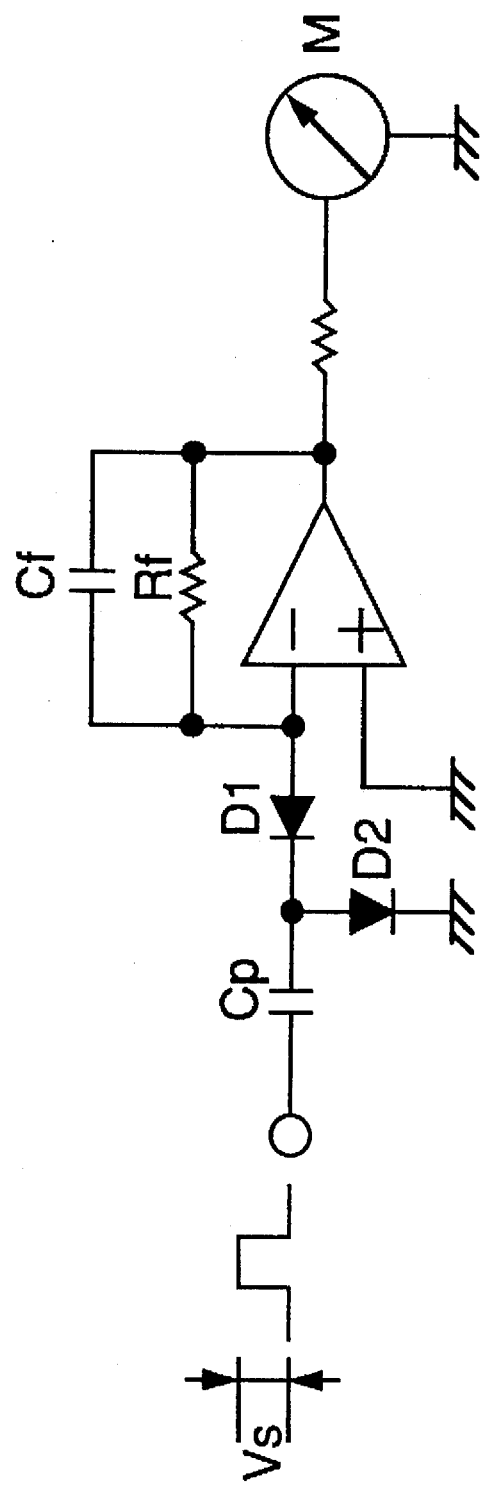
FIG. 4 is a circuit diagram of a pulse rate meter.

FIG. 3 is a practical circuit diagram of the switching circuit 9.

On the band switching pulse signal inputted via the BS-IF signal cutoff inductor 18 are superimposed various noises as shown in A of FIG. 3. Therefore, firstly frequency components except for the frequency component of 22 kHz±4 kHz are removed by means of a BPF (Band-pass Filter) 25 or a LPF (Low-pass Filter) 26 constituting the filter circuit 11 so as to obtain a pulse signal having a peak value $V_f$=0.6 V as shown in B of FIG. 3 (band switching pulse signal).

Thus the possible malfunction due to noises at frequencies except for the frequency of the band switching pulse signal is prevented.

Since the thus obtained peak value of the band switching pulse signal is about 0.6 V as described above, the band switching pulse signal is hardly detected by the comparator circuit 14 at high sensitivity. Therefore, the voltage is amplified by ten times to a voltage $V_T$ (=6 V±2 V) as shown in C of FIG. 3 in the differential amplifier 12 including an operational amplifier 29.

In detail, when the aforementioned pulse signal is inputted to a non-inverted input terminal of the operational amplifier 29, with provision of chip resistors 27 and 28 having resistance values R27 and R28, an electric potential $R_{28}/R_{27}$ (a ratio of $R_{28}$ to $R_{27}$) times as high as the input voltage appears at an output terminal. The ratio (i.e., amplification factor) achieved by the resistance values of the chip resistors 27 and 28 can be freely 25 selected within a range of 1 to 20 times by varying the resistance value $R_{27}$ of the chip resistor 27. That is, the responsiveness of the present switching circuit 9 can be adjusted by the amplification factor depending on the resistance value $R_{27}$ of the chip resistor 27 constituting a reference voltage adjuster.

The thus amplified band switching pulse signal is rectified by diodes 30 and 31 constituting the rectifying circuit 13 to thereby obtain a DC voltage Vp as shown in D of FIG. 3. The rectifying circuit 13 has a feature that it can perform a digital-to-analog conversion operation regardless of the ambient temperature so long as a specified sensitivity is assured through sensitivity setting of the differential amplifier 12.

It is to be noted that a resistor 32 and a capacitor 33 form a low-pass filter as the aforementioned filter for removing the band switching pulse signal and other noises superimposed on a control signal to the local oscillators 16 and 17 to thereby reduce undesired influence on the local oscillators 16 and 17. A resistor 34 is a resistor for discharging the electric potential charged in the capacitor 33.

The DC voltage Vp obtained by the rectifying circuit 13 is inputted to an inverted input terminal of an operational amplifier 35 constituting the comparator circuit 14. Then, the voltage is compared with a reference electric potential that is provided by a battery 36 and inputted to a noninverted input terminal of the amplifier, and then an inverted output is yielded from an output terminal of the amplifier.

In detail, when the band switching pulse signal is inputted to the switching circuit 9, the DC voltage Vp from the diodes 30 and 31 is inputted to the inverted input terminal of the operational amplifier 35 while keeping the electric potential of 6 V±2 V. Consequently, the output of the operational amplifier 35 comes to have an electric potential $V_L$ (=0 V) as shown in E of FIG. 3. Conversely, when the band switching pulse signal is not inputted, the DC voltage Vp from the diodes 30 and 31 is inputted to the inverted input terminal of the operational amplifier 35 while keeping the electric potential of 0 V. Consequently, the output of the operational amplifier 35 comes to have an electric potential $V_H$ (=8 V) as shown in E of FIG. 3.

A switch 37 of the drive circuit 15 is switched to a local oscillator drive transistor 39 side when the output voltage of the operational amplifier 35 becomes $V_H$. Then, the local oscillator drive transistor 39 is turned on to turn on the low-band local oscillator 17 connected to an output terminal 41. Meanwhile, a local oscillator drive transistor 38 is turned off to turn off the high-band local oscillator 16 connected to an output terminal 40. Thus the reception frequency band is set to the low band side of 10.7 GHz to 11.75 GHz.

Conversely, when the output voltage of the operational amplifier 35 becomes $V_L$, the switch 37 is switched to the local oscillator drive transistor 38 side. Then, the local oscillator drive transistor 38 is turned on to turn on the high-band local oscillator 16 connected to the output terminal 40. Meanwhile, the local oscillator drive transistor 39 is turned off to turn off the low-band local oscillator 17 connected to the output terminal 41. Thus the reception frequency band is set to the high band side of 11.7 GHz to 12.75 GHz.

When the reception frequency band is thus set by the operation of the switching circuit 9, a frequency conversion operation is performed in a manner as follows.

A BS signal in a frequency band of 12 GHz transmitted from a satellite is converged on the feed horn 5 of the BS converter 4 by the parabola antenna 6, and then transmitted to a low-noise amplifier 19 (refer to FIG. 2) where the signal is separated into a vertically polarized wave and a horizontally polarized wave. In the above place, selection between the vertically polarized wave and the horizontally polarized wave is performed by switching an HEMT (High Electron Mobility Transistor) constituting the low-noise amplifier 19 by a switching operation of a switch 24 according to a state of high (18 V) or low (13 V) of a power source supplied to a power supply 23.

The low-noise amplifier 19 has three stages. The first stage of the low-noise amplifier 19 performs amplification of the vertically polarized wave and the horizontally polarized wave as well as the above-mentioned switching operation. The second and third stages amplify the polarized wave selected by the switching operation of the first stage.

A microwave BPF 20 removes frequency components except for the microwave frequency (12 GHz) from the received BS signal so as to suppress interference electric waves. Thus the microwave signal obtained through the amplification and noise removal processes is supplied to a mixer 21. The mixer 21 outputs a signal of difference between the microwave signal from the microwave BPF 20 and the signal from the local oscillator corresponding to the reception frequency band set in a manner as described above among the high-band local oscillator 16 and the low-band local oscillator 17 as the aforementioned BS-IF signal, The thus obtained BS-IF signal is amplified in a BS-IF amplifier 22, and then transmitted to the BS tuner 1 via the F-type connector 3 which serves as a BS converter output terminal.

Thus, in the present embodiment, when the reception signal band on the high band side is selected, the pulse signal obtained by superimposing the band switching pulse signal on the power voltage is supplied from the BS tuner 1 to the BS converter 4. Then, the BS converter 4 amplifies and rectifies a pulse signal extracted by means of the filter circuit 11 of the built-in switching circuit 9 with the differential amplifier 12 and the rectifying circuit 13, and compares the resulting signal with the reference voltage in the comparator circuit 14, thereby detecting the presence or absence of the band switching pulse signal. When the band switching pulse signal is detected, the high-band local oscillator 16 is turned on by the drive circuit 15. When the band switching pulse signal is not detected, the low-band local oscillator 17 is turned on.

In the above-mentioned case, the differential amplifier 12 amplifies the inputted band switching pulse signal having a voltage of about 0.6 V by about ten times to the voltage $V_T$ (=6 V±2 V). Therefore, a high sensitivity is assured to allow a high accuracy operation to be achieved.

Furthermore, by varying the resistance value $R_{27}$ of the chip resistor 27, the amplification factor of the differential amplifier circuit 12 can be varied. Therefore, the sensitivity in switching over between the local oscillators 16 and 17 can be adjusted to be arbitrarily set by means of the present switching circuit 9.

Furthermore, the rectifying circuit 13 performs a rectifying operation by means of the two diodes 30 and Therefore, the switching circuit 9 can be implemented with a simpler circuit construction than in a case where a pulse rate meter is used for rectifying.

Furthermore, the rectifying circuit 13 has the low-pass filter comprised of the resistor 32 and the capacitor 33. Therefore, the band switching pulse signal and other noises can be prevented from being superimposed on the control signal to the local oscillators 16 and 17, thereby reducing undesired influence on the local oscillators 16 and 17.

In the above-mentioned embodiment, the responsiveness of the switching circuit 9 is adjusted by varying the resistance value $R_{27}$ of the chip resistor 27. However, the present invention is not limited to this, and it is acceptable to make variable, for example, the reference electric potential of the operational amplifier 35 of the comparator circuit 14 by using a rheostat (not shown).

As apparent from the above, the switching circuit of the BS converter of the present invention includes the filter circuit which extracts only the frequency component of the band switching pulse signal from the pulse signal transmitted from the BS tuner, the amplifier circuit which amplifies the extracted pulse signal from the filter circuit, the rectifying circuit which rectifies the amplified pulse signal, the comparator circuit which compares the obtained DC voltage and the reference voltage to decide the presence or absence of the band switching pulse signal, and the drive circuit for driving the local oscillator having an oscillation frequency corresponding to the result of comparison (result of decision) of the comparator circuit. With the above-mentioned arrangement, the band switching pulse signal having a very low peak value can be amplified to allow detection thereof at high sensitivity.

Therefore, by transmitting the pulse signal which is the band switching pulse signal that is superimposed on the power voltage from the BS tuner to the BS converter, the reception signal band can be switchedly selected with high accuracy.

In a switching circuit of a BS converter of a preferred embodiment, the rectifying circuit performs a rectifying operation by means of diodes. Therefore, the circuit is allowed to have a very simple construction.

In a switching circuit of a BS converter of a preferred embodiment, the filter circuit includes a low-pass filter. Therefore, high-frequency noises are removed from the pulse signal transmitted from the BS tuner to allow only the frequency component of the band switching pulse signal to be surely extracted.

In a switching circuit of a BS converter of a preferred embodiment, the filter circuit includes a band-pass filter. Therefore, noises of frequency components except for the frequency component of the band switching pulse signal can be surely removed from the pulse signal transmitted from the BS tuner.

In a switching circuit of a BS converter of a preferred embodiment, the amplifier circuit is provided with an amplification factor adjuster. Therefore, the responsiveness in switching over between the local oscillators can be arbitrarily set by adjusting the amplification factor of the pulse signal in the amplifier circuit.

In a switching circuit of a BS converter of a preferred embodiment, a reference voltage adjuster is provided. Therefore, the responsiveness in switching over between the local oscillators can be arbitrarily set according to a reference voltage adjusted by the reference voltage adjuster.

In a switching circuit of a BS converter of a preferred embodiment, the rectifying circuit is provided with a filter. Therefore, noises of the frequency component of the band switching pulse signal and the like can be removed from the signal obtained through the rectifying process.

Therefore, the possible superimposition of noises on the drive signal from the drive circuit to the local oscillators can be prevented.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A switching circuit for a satellite broadcasting converter for switching between a plurality of local oscillators which have respective different oscillation frequencies, the plurality of local oscillators being provided in the satellite broadcasting converter and being switched according to a pulse signal transmitted from a satellite broadcasting tuner, the pulse signal including a frequency band switching pulse signal selectively superimposed on a power voltage, comprising:

a filter circuit, coupled to the pulse signal from the satellite broadcasting tuner, for extracting only a frequency component of the frequency band switching pulse signal and outputting an extracted pulse signal;

an amplifier circuit, coupled to said filter circuit, for amplifying the extracted pulse signal and outputting an amplified pulse signal;

a rectifying circuit, coupled to said amplifier circuit, for rectifying the amplified pulse signal;

a comparator circuit, coupled to said rectifying circuit, for comparing a DC voltage output by said rectifying circuit with a reference voltage and outputting a comparison signal representing whether or not the frequency band switching pulse signal is superimposed on the power voltage; and a drive circuit, coupled to said comparator circuit, for driving a respective one of the plurality of local oscillators having a respective oscillation frequency selected in accordance with the comparison indicative of a result of comparison by said comparator circuit.

2. The switching circuit for a satellite broadcasting converter as claimed in claim 1, wherein said rectifying circuit comprised diodes.

3. The switching circuit for a satellite broadcasting converter as claimed in claim 1, wherein said filter circuit is a low-pass filter.

4. The switching circuit for a satellite broadcasting converter as claimed in claim 1, wherein said filter circuit is a band-pass filter.

5. The switching circuit for a satellite broadcasting converter as claimed in claim 1, wherein said amplifier circuit comprises amplification factor adjusting means for adjusting an amplification factor of the extracted pulse signal.

6. The switching circuit for a satellite broadcasting converter as claimed in claim 1, further comprising reference voltage adjusting means for adjusting the reference voltage.

7. The switching circuit for a satellite broadcasting converter as claimed in claim 1, wherein said rectifying circuit is provided with filter means for filtering the dc voltage output to said comparator circuit.

8. A method of switching between a plurality of respective different local oscillation frequencies in a satellite broadcasting converter in accordance with a pulse signal transmitted from a satellite broadcasting tuner, the pulse signal including a frequency band switching pulse signal superimposed on a power voltage, comprising the steps of:

a) extracting only a frequency component of the frequency band switching pulse signal from the pulse signal received from the satellite broadcasting tuner to provide an extracted pulse signal;

b) amplifying the extracted pulse signal to provide an amplified pulse signal;

c) rectifying the amplified pulse signal to provide a rectified voltage;

d) comparing the rectified voltage with a DC voltage to provide a comparison signal representing whether or not the frequency band switching pulse signal is superimposed on the power voltage; and e) selecting one of the plurality of respective different local oscillation frequencies in accordance with the comparison signal.

9. The method of switching as claimed in claim 8, wherein said step c) comprises rectifying the amplified pulse signal with diodes.

10. The method of switching as claimed in claim 8, wherein said step a) comprises extracting the frequency component of the frequency band switching pulse signal with a low-pass filter.

11. The method of switching as claimed in claim 8, wherein said step a) comprises extracting the frequency component of the frequency band switching pulse signal with a band-pass filter.

12. The method of switching as claimed in claim 8, wherein said step b) comprises amplifying the extracted pulse signal with an adjustable amplification factor.

13. The method of switching as claimed in claim 8, wherein said step d) comprises comparing the rectified voltage to an adjustable reference voltage.

14. The method of switching as claimed in claim 8, wherein said step c) further comprises filtering the rectified voltage.

15. A broadcasting converter for switching between a plurality of local oscillators which have respective different oscillation frequencies comprising:

filter means, coupled to an externally provided pulse signal having a frequency band switching pulse signal selectively superimposed on a power voltage, for extracting the frequency band switching pulse signal from the pulse signal;

amplification means, coupled to said filter means, for amplifying the extracted frequency band switching pulse signal and outputting an amplified pulse signal;

rectifying means, coupled to said amplification means, for rectifying the amplified pulse signal into a DC voltage;

comparison means, coupled to said rectifying means, for comparing the DC voltage with a reference voltage to determine if the frequency band switching pulse signal is superimposed on the power voltage and for providing a comparison signal indicative thereof; and drive means, coupled to said comparison means, for driving a respective one of the plurality of local oscillators having a respective oscillation frequency in accordance with the comparison signal.

16. The broadcasting converter of claim 15, wherein said rectifying means comprises filtering means for filtering the DC voltage to remove the extracted frequency band switching pulse signal and noise.

17. The broadcasting converter of claim 15, further comprising reference voltage adjustment means for adjusting the reference voltage to improve sensitivity of said comparison means.

18. The broadcasting converter of claim 15, further comprising amplification factor adjusting means for adjusting an amplification factor of said amplification means.

19. The broadcasting converter of claim 15, wherein the respective different oscillation frequencies are satellite broadcasting frequencies.

* * * * *